United States Patent
Okuyama et al.

(10) Patent No.: US 11,452,209 B2
(45) Date of Patent: Sep. 20, 2022

(54) ELECTRONIC COMPONENT AND ITS MANUFACTURING METHOD

(71) Applicant: TDK CORPORATION, Tokyo (JP)

(72) Inventors: Yuichiro Okuyama, Tokyo (JP); Takeshi Oohashi, Tokyo (JP); Hajime Kuwajima, Tokyo (JP); Takashi Ohtsuka, Tokyo (JP); Kazuhiro Yoshikawa, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/134,316

(22) Filed: Dec. 26, 2020

(65) Prior Publication Data

US 2021/0219430 A1 Jul. 15, 2021

(30) Foreign Application Priority Data

Jan. 10, 2020 (JP) .............................. JP2020-002924

(51) Int. Cl.
 *H05K 1/02* (2006.01)
 *H05K 1/16* (2006.01)
 *H05K 1/14* (2006.01)

(52) U.S. Cl.
 CPC ............ *H05K 1/162* (2013.01); *H05K 1/0298* (2013.01); *H05K 1/144* (2013.01); *H05K 2201/10015* (2013.01); *H05K 2201/10651* (2013.01)

(58) Field of Classification Search
 CPC ....... H05K 1/0298; H05K 2201/09145; H05K 2201/09154; H05K 2201/09163; H05K 1/144; H05K 2201/041; H05K 1/162; H05K 2201/10651; H05K 2201/10015
 See application file for complete search history.

(56) References Cited

U.S. PATENT DOCUMENTS

| | | | | |
|---|---|---|---|---|
| 4,288,841 | A * | 9/1981 | Gogal | H01L 23/49822 361/792 |
| 5,625,221 | A * | 4/1997 | Kim | H01L 25/105 257/686 |
| 6,351,028 | B1 * | 2/2002 | Akram | H01L 23/3185 257/686 |
| 7,863,722 | B2 * | 1/2011 | Chua | H01L 24/97 257/686 |
| 8,174,107 | B2 * | 5/2012 | Shinma | H01L 23/49555 257/686 |
| 9,560,753 | B2 * | 1/2017 | Wu | H05K 3/0017 |
| 2007/0176275 | A1 * | 8/2007 | Singleton | H01L 24/73 257/686 |
| 2008/0135155 | A1 | 6/2008 | Kawamura et al. | |
| 2010/0284161 | A1 * | 11/2010 | Motohara | H05K 1/0268 361/803 |

(Continued)

FOREIGN PATENT DOCUMENTS

JP 2008034626 A 2/2008

*Primary Examiner* — Steven T Sawyer
(74) *Attorney, Agent, or Firm* — Young Law Firm, P.C.

(57) ABSTRACT

Disclosed herein is an electronic component that includes a substrate and a plurality of conductive layers and a plurality of insulating layers which are alternately laminated on the substrate. The side surface of at least one of the plurality of insulating layers has a recessed part set back from a side surface of the substrate and a projecting part projecting from the recessed part.

16 Claims, 26 Drawing Sheets

(56) References Cited

U.S. PATENT DOCUMENTS

| | | | | |
|---|---|---|---|---|
| 2014/0177179 | A1* | 6/2014 | Iiyama | H05K 3/3442 |
| | | | | 361/748 |
| 2015/0115474 | A1* | 4/2015 | Pham | H01L 24/80 |
| | | | | 257/777 |
| 2015/0362133 | A1* | 12/2015 | Lin | F21K 9/20 |
| | | | | 362/382 |
| 2016/0278208 | A1* | 9/2016 | Pen | H05K 3/4623 |
| 2019/0174627 | A1* | 6/2019 | Matsushita | H05K 1/16 |
| 2020/0375034 | A1* | 11/2020 | Watanabe | H05K 1/0298 |

\* cited by examiner

ELECTRONIC COMPONENT AND ITS MANUFACTURING METHOD

BACKGROUND OF THE INVENTION

Field of the Invention

The present invention relates to an electronic component and its manufacturing method and, more particularly, to an electronic component in which a plurality of conductive layers and a plurality of insulating layers are alternately laminated on a substrate and a manufacturing method for such an electronic component.

Description of Related Art

JP 2008-34626A discloses an electronic component in which a plurality of conductive layers and a plurality of insulating layers are alternately laminated on a substrate. The electronic component described in JP 200-34626A has a capacitor and an inductor on the substrate and thus functions as an LC filter. Such electronic components are typically collectively fabricated using an aggregate substrate, followed by dicing for individualization, whereby many pieces of the electronic components are obtained.

However, the above electronic component has the following problems. When the aggregate substrate is subjected to dicing for individualization of the electronic component, the side surface of the electronic component is flattened, which may not always allow heat from the side surface to be satisfactorily dissipated. Further, when the number of insulating layers is large, or when the thickness of the insulating layer is large, it becomes difficult to dice the aggregate substrate.

SUMMARY

It is therefore an object of the present invention to provide an electronic component in which a plurality of conductive layers and a plurality of insulating layers are alternately laminated on a substrate, capable of improving heat dissipation from the side surface thereof.

Another object of the present invention is to provide a manufacturing method for an electronic component in which a plurality of conductive layers and a plurality of insulating layers are alternately laminated on a substrate, capable of facilitating dicing even when the number of the insulating layers is large or when the thickness of the insulating layer is large.

An electronic component according to the present invention includes: a substrate; and a plurality of conductive layers and a plurality of insulating layers which are alternately laminated on the substrate. The side surface of at least one of the plurality of insulating layers has a recessed part set back from the side surface of the substrate and a projecting part projecting from the recessed part.

According to the present invention, the side surface of each of the plurality of insulating layers has a recess-and-projection shape and thus has an increased exposed area. This can improve heat dissipation from the side surface of the electronic component.

In the present invention, the side surfaces of all the plurality of insulating layers may each have the recessed part and projecting part. This further increases the total exposed area of the electronic component at the side surface thereof, thereby further improving heat dissipation from the side surface of the electronic component.

In the present invention, at least one of the plurality of insulating layers may have the recessed part and projection part over the entire side periphery thereof. This further increases the exposed area per insulating layer, thereby further improving heat dissipation from the side surface of the electronic component.

In the present invention, the side surface of the substrate and an end surface of the projecting part may be flush with each other. This prevents the outer diameter size of the electronic component from increasing beyond necessity.

In the present invention, the projecting amount of the projecting part from the recessed part may be 3 μm or more and 10 μm or less. This makes it possible to sufficiently improve heat dissipation from the side surface of the electronic component while suppressing an increase in the outer diameter size of the electronic component.

An electronic component manufacturing method according to the present invention includes the steps of: fabricating a plurality of electronic components at the same time by alternately laminating a plurality of conductive layers each including a sacrificial pattern and a plurality of insulating layers on a substrate; forming a space between the plurality of electronic components by removing the sacrificial patterns; and individualizing the plurality of electronic components by dicing the substrate along the space.

According to the present invention, the substrate is diced along the space, which facilitates dicing even when the number of insulating layers is large, or when the thickness of the insulating layer is large.

As described above, according to the present invention, there can be provided an electronic component in which a plurality of conductive layers and a plurality of insulating layers are alternately laminated on a substrate, capable of improving heat dissipation from the side surface thereof. Further, according to the present invention, there can be provided a manufacturing method for an electronic component in which a plurality of conductive layers and a plurality of insulating layers are alternately laminated on a substrate, capable of facilitating dicing even when the number of the insulating layers is large or when the thickness of the insulating layer is large.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Hereinafter, a preferred embodiment of the present invention will be described in detail with reference to the accompanying drawings.

Figure 1:
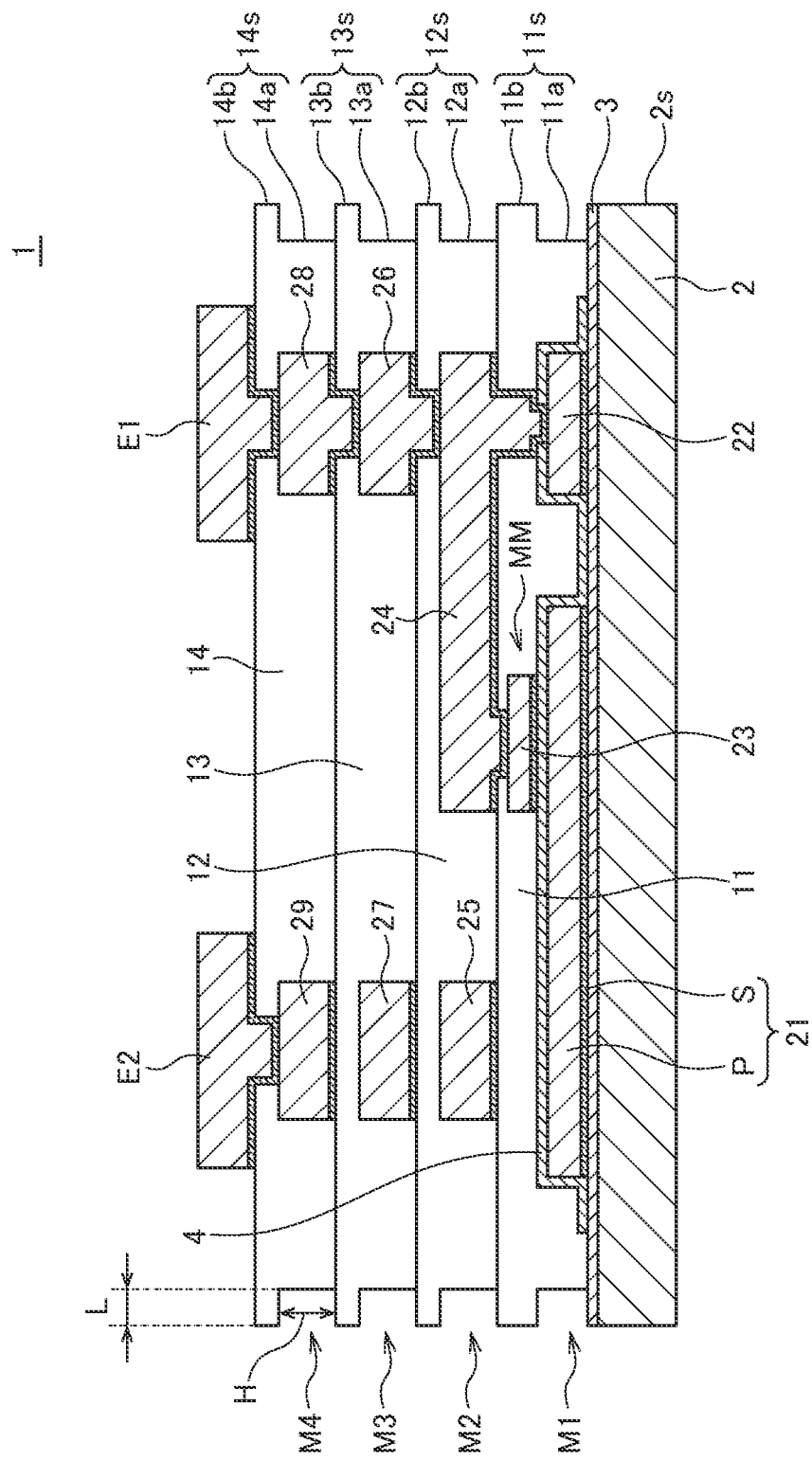
FIG. 1 is a cross-sectional view for explaining the structure of an electronic component 1 according to a preferred embodiment of the present embodiment.

FIG. 1 is a cross-sectional view for explaining the structure of an electronic component 1 according to a preferred embodiment of the present embodiment.

The electronic component 1 according to the present embodiment is an LC filter and includes a substrate 2 and conductive layers M1 to M4 and insulating layers 11 to 14 which are alternately laminated on the upper surface of the substrate 2 as illustrated in FIG. 1. The material for the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

The conductive layer M1 is a conductive layer positioned in the lowermost layer and includes conductive patterns 21 and 22. The conductive patterns 21 and 22 are each constituted of a thin seed layer S contacting the planarizing layer 3 and a plating layer P having a film thickness larger than that of the seed layer S. Similarly, the conductive patterns positioned in other conductive layers are each formed of a laminated body of the seed layer S and plating layer P. The conductive pattern 21 constitutes a capacitor lower electrode and is covered at the upper and side surfaces thereof with a dielectric film (capacitive insulating film) 4. The dielectric film 4 is not present at the outer peripheral portion of the electronic component 1, whereby a stress is relieved.

A conductive pattern 23 is formed on the upper surface of the conductive pattern 21 through the dielectric film 4. The conductive pattern 23 belongs to a conductive layer MM positioned between the conductive layers M1 and M2 and constitutes a capacitor upper electrode. This forms a capacitor having the lower and upper electrodes constituted by the conductive patterns 21 and 23, respectively. The conductive layers M1 and MM are covered with the insulating layer 11.

The conductive layer M2 is the second conductive layer, which is provided on the surface of the insulating layer 11 and includes conductive patterns 24 and 25. The conductive pattern 24 is connected to the conductive patterns 22 and 23 through openings formed in the insulating layer 11. The conductive layer M2 is covered with the insulating layer 12.

The conductive layer M3 is the third conductive layer, which is provided on the surface of the insulating layer 12 and includes conductive patterns 26 and 27. The conductive pattern 26 is connected to the conductive pattern 24 through an opening formed in the insulating layer 12. The conductive layer M3 is covered with the insulating layer 13.

The conductive layer M4 is the fourth conductive layer, which is provided on the surface of the insulating layer 13 and includes conductive patterns 28 and 29. The conductive pattern 28 is connected to the conductive pattern 26 through an opening formed in the insulating layer 13. The conductive layer M4 is covered with the insulating layer 14.

Terminal electrodes E1 and E2 are provided on the upper surface of the insulating layer 14. The terminal electrodes E1 and E2 are connected respectively to the conductive patterns 28 and 29 through openings formed in the insulating layer 14. The conductive patterns 25, 27, and 29 each constitute, e.g., a part of a coil pattern. Thus, a capacitor and an inductor are integrated on the substrate 2.

As illustrated in FIG. 1, in the present embodiment, side surfaces 11s to 14s of the insulating layers 11 to 14 are each not flat but have a level difference. The term "side surface" used herein refers to an end surface in a planar direction perpendicular to the lamination direction. The side surface 11s of the insulating layer 11 has a recessed part 11a set back inward from the side surface 2s of the substrate 2 and a projecting part 11b projecting from the recessed part 11a. Similarly, the side surfaces 12s to 14s of the insulating layers 12 to 14 have recessed parts 12a to 14a set back inward from the side surface 2s of the substrate 2 and projecting parts 12b to 14b projecting from the recessed parts 12a to 14a.

In the electronic component 1 according to the present embodiment, the side surfaces 11s to 14s of the insulating layers 11 to 14 each have the recess-and-projection shape, so that the exposed area of the side surfaces 11s to 14s is increased to improve heat dissipation from the side surfaces 11s to 14s. In addition, when the electronic component 1 according to the present embodiment is turned upside down from the state illustrated in FIG. 1 and mounted on a circuit board, a solder that covers the terminal electrodes E1 and E2 becomes less likely to flow around to the side surfaces 11s to 14s, thereby increasing reliability. A projecting amount L of the projecting parts 11b to 14b from the respective recessed parts 11a to 14a is preferably 3 µm or more and 10 µm or less. This is because a 3 µm or more projecting amount L allows sufficient improvement in heat dissipation and a 10 µm or less projecting amount L allows sufficient suppression of an increase in the planar size of the electronic component 1. A height H of each of the recessed parts 11a to 14a is set equal to the thickness of the conductive pattern that belongs to the same conductive layer thereas from a view point of a manufacturing process to be described later.

The following describes a manufacturing method for the electronic component 1 according to the present embodiment.

FIGS. 2 to 21 are process views for explaining the manufacturing method for the electronic component 1 according to the present embodiment. Although many pieces of the electronic components 1 are obtained from an aggregate substrate in the manufacturing process of the electronic component 1, the following description will be given focusing on the manufacturing process of one electronic component 1.

Figure 2:
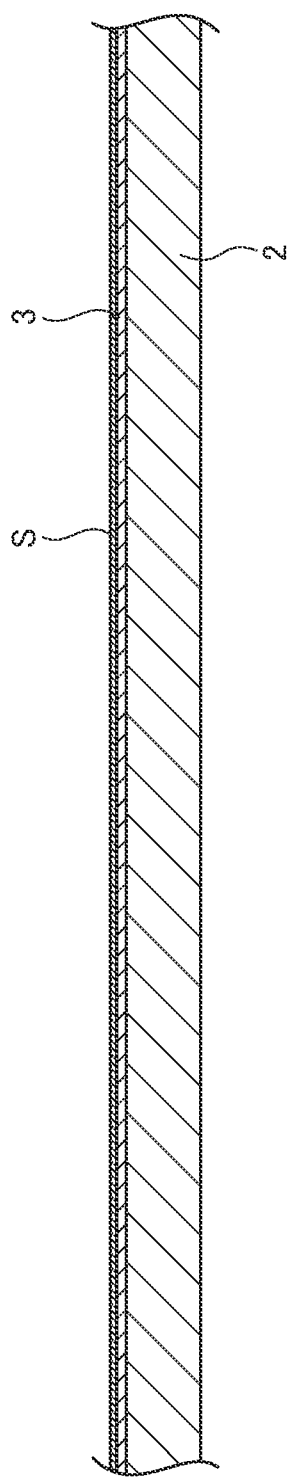
FIGS. 2 to 21 are process views for explaining the manufacturing method for the electronic component 1 according to the preferred embodiment of the present embodiment.
Figure 3:
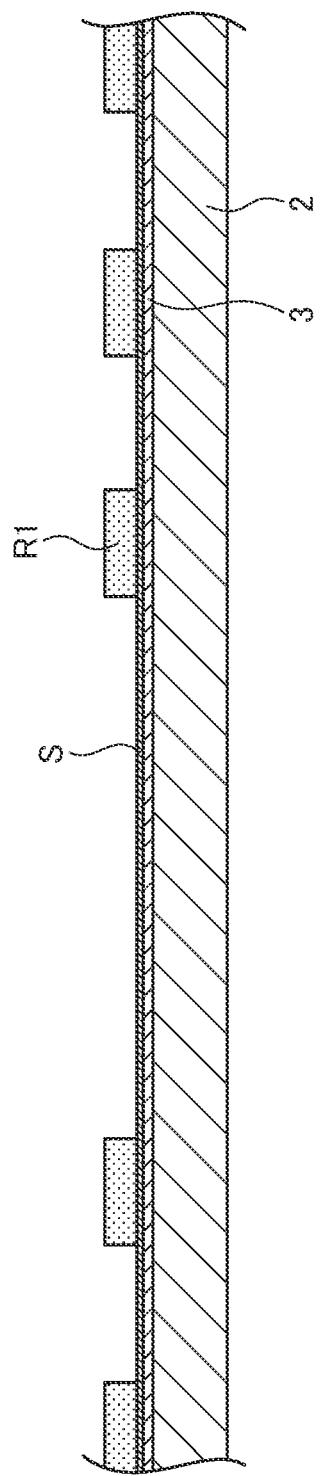
Figure 4:
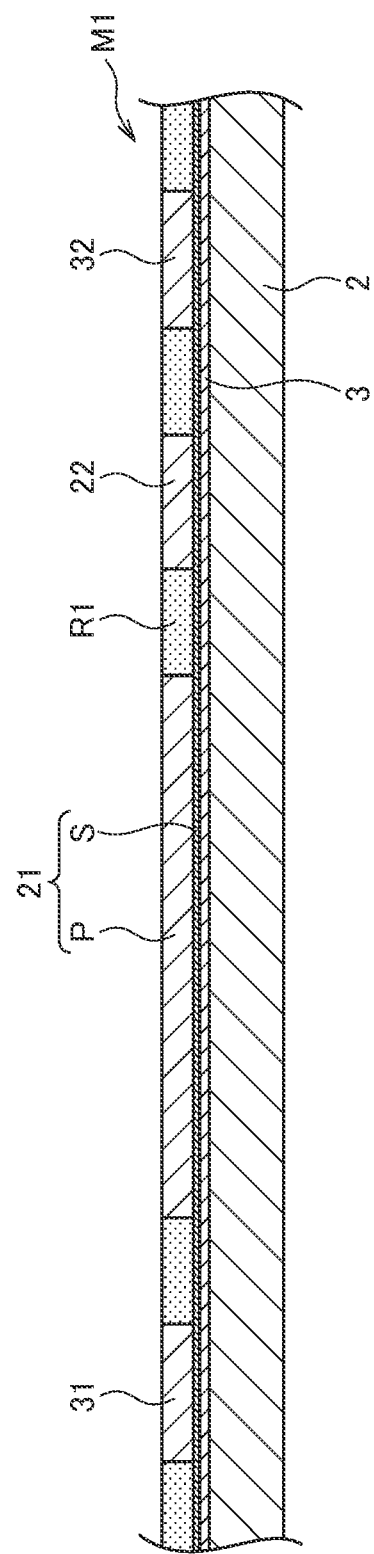
Figure 5:
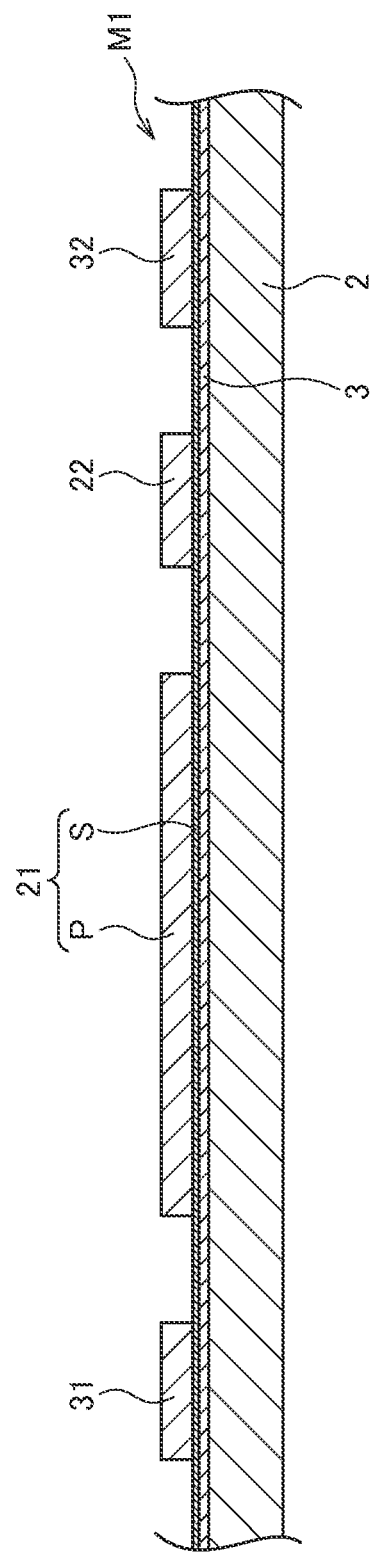
Figure 6:
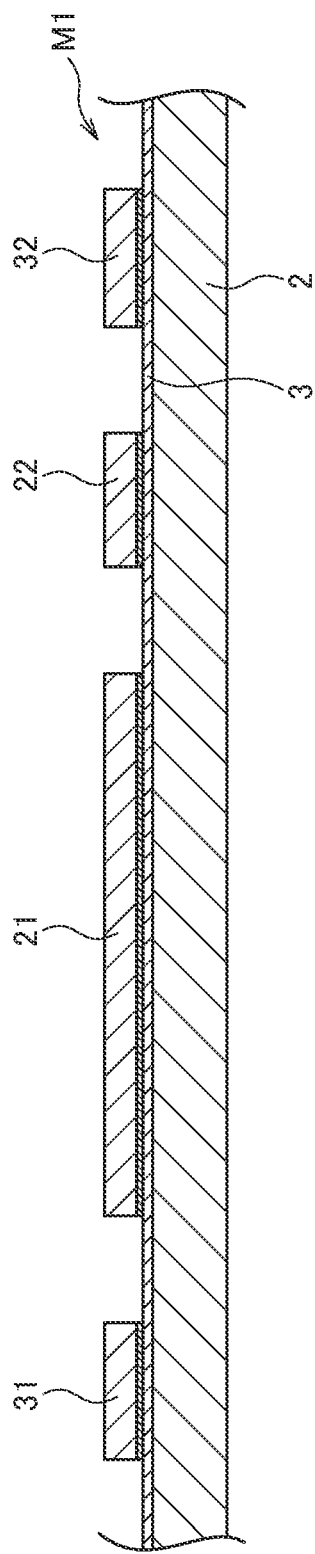

As illustrated in FIG. 2, the planarizing layer 3 is formed by sputtering or other method on the substrate (aggregate substrate) 2, and the surface of the planarizing layer 3 is subjected to grinding or mirror finishing such as CMP for planarization. Thereafter, the seed layer S is formed by sputtering or other method on the surface of the planarizing layer 3. Subsequently, as illustrated in FIG. 3, a resist layer R1 is spin-coated on the seed layer S and then patterned so as to expose a part of the seed layer S on which the conductive layer M1 is to be formed. In this state, electrolyte plating is performed using the seed layer S as a feeder to form the plating layer P on the seed layer S as illustrated in FIG. 4. A laminated body of the seed layer S and plating layer P constitutes the conductive layer M1. In the cross section illustrated in FIG. 4, the conductive layer M1 includes the conductive patterns 21, 22 and sacrificial patterns 31 and 32. Then, the resist layer R1 is removed as illustrated in FIG. 5, and the exposed seed layer S is removed as illustrated in FIG. 6, whereby the conductive layer M1 is completed. The removal of the seed layer S can be achieved by etching or ion milling.

Figure 7:
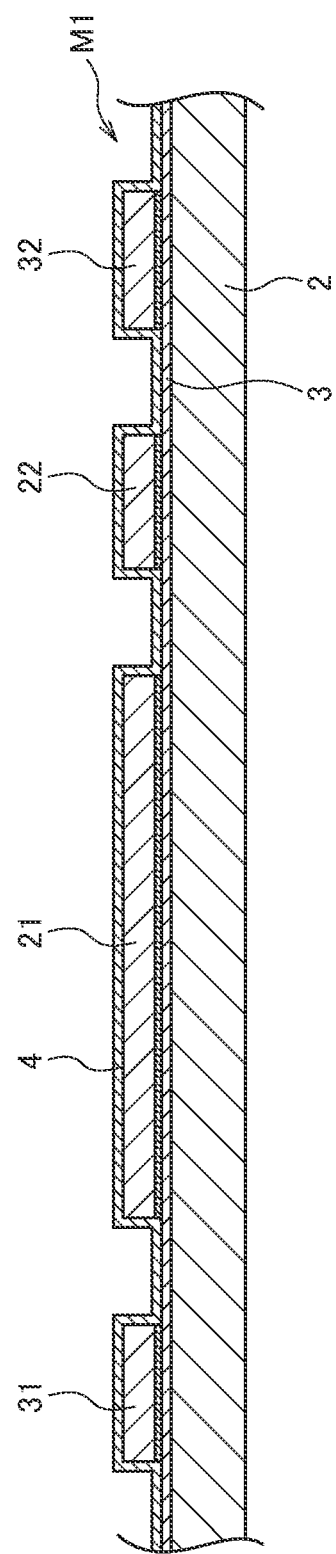

Then, as illustrated in FIG. 7, the dielectric film 4 is formed on the entire surface of the conductive layer M1 including the upper and side surfaces thereof. The dielectric film 4 may be made of, e.g., a paraelectric material such as silicon nitride (SiNx) or silicon oxide (SiOx), or a known ferroelectric material. The dielectric film 4 can be formed by sputtering, plasma CVD, MOCVD, sol-gel, electron beam vapor deposition, or other method.

Figure 8:
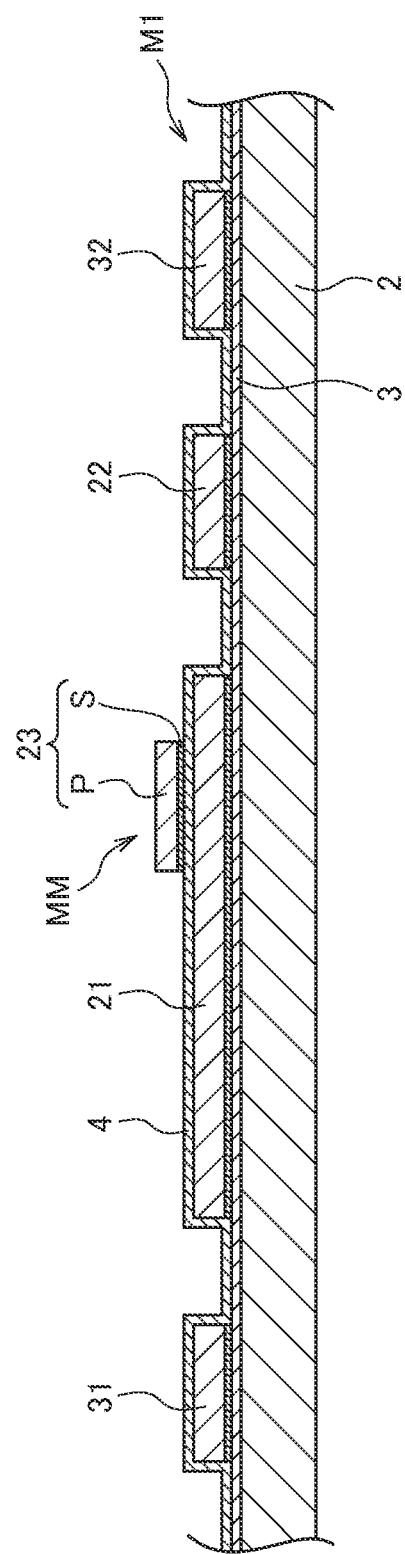
Figure 9:
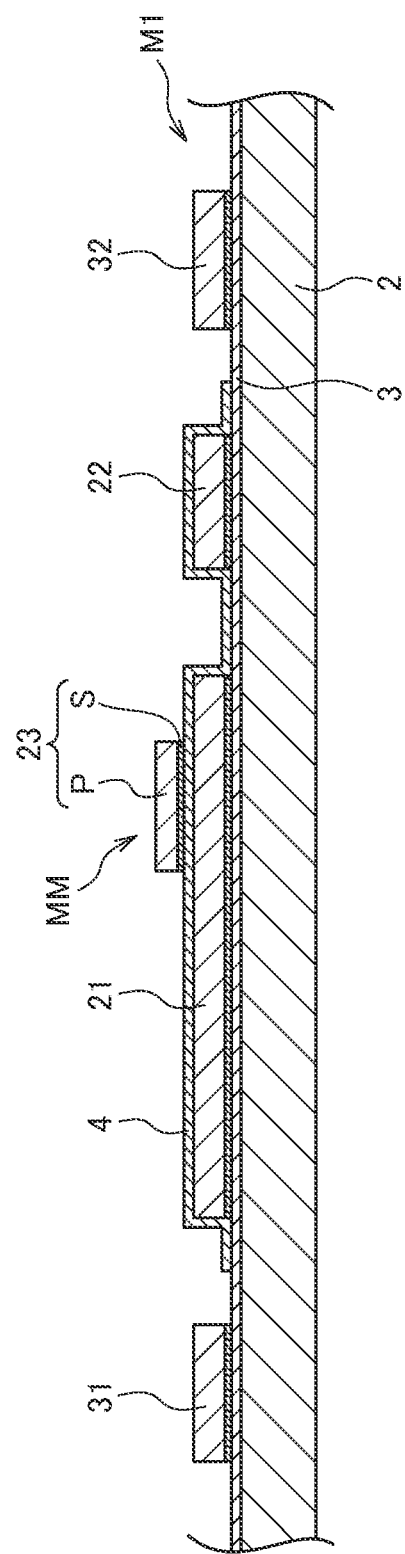

Then, as illustrated in FIG. 8, the conductive pattern 23 is formed on the upper surface of the conductive pattern 21 through the dielectric film 4 using the same method as the formation method for the conductive layer M1. The conductive pattern 23 is also formed of a laminated body of the seed layer S and plating layer P. This completes the conductive layer MM to thereby form a capacitor having the lower and upper electrodes constituted by the conductive patterns 21 and 23, respectively. Although not particularly limited, it is preferable to make the film thickness of the conductive layer MM smaller than that of the conductive layer M1. This increases processing accuracy of the conductive layer MM to reduce a variation in capacitance due to processing accuracy. Thereafter, as illustrated in FIG. 9, a part of the dielectric film 4 to become the outer peripheral portion of the electronic component 1 is removed.

Figure 10:
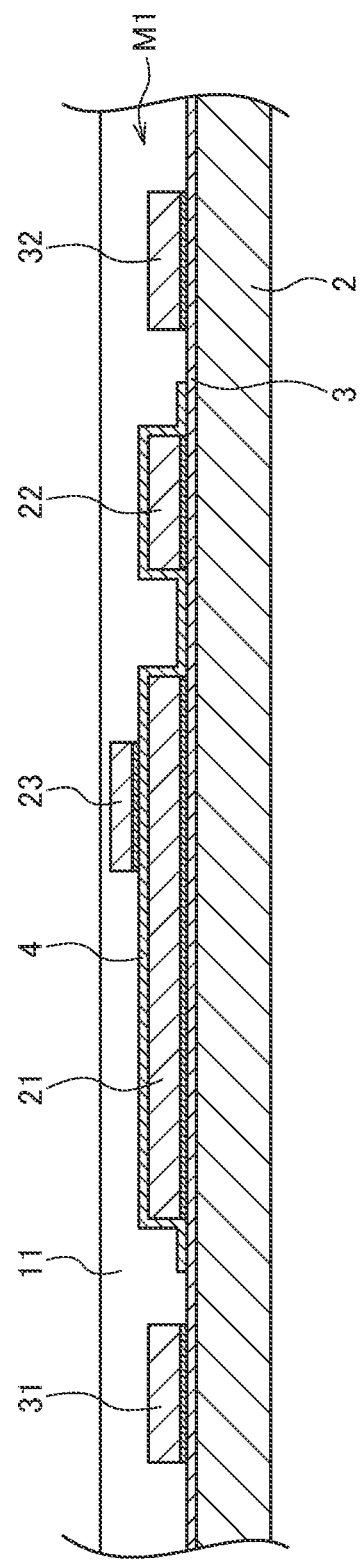
Figure 11:
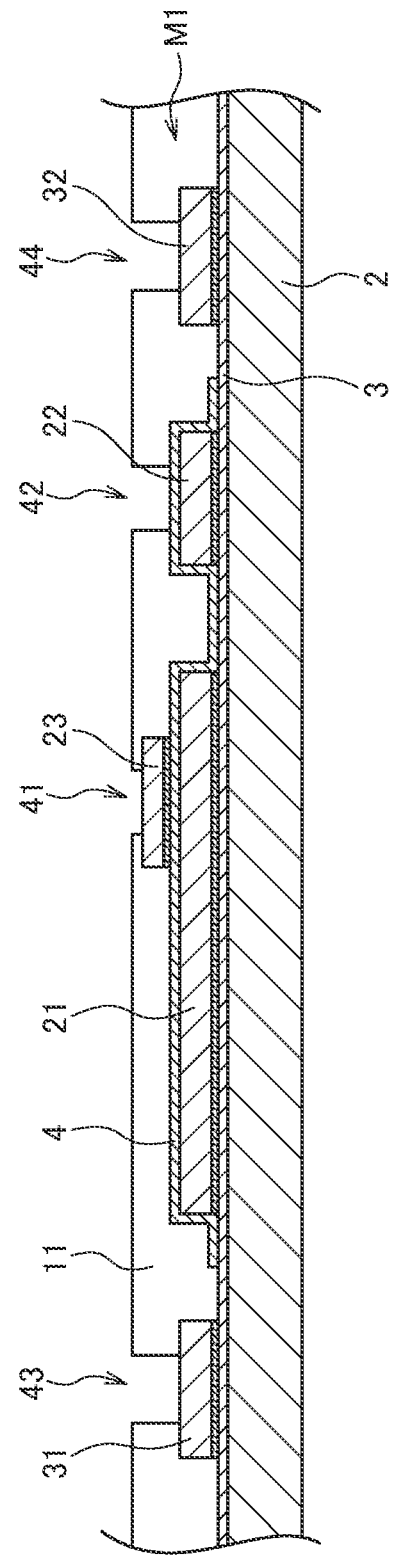

Then, as illustrated in FIG. 10, the insulating layer 11 that covers the conductive layers M1 and MM is formed and then patterned to form openings 41 to 44 in the insulating layer 11 as illustrated in FIG. 11. In this state, the upper surfaces of the conductive patterns 23 and 22 are exposed through the openings 41 and 42, respectively, and the dielectric film 4 that covers the upper surfaces of the conductive patterns 31 and 32 is exposed through the openings 43 and 44.

Figure 12:
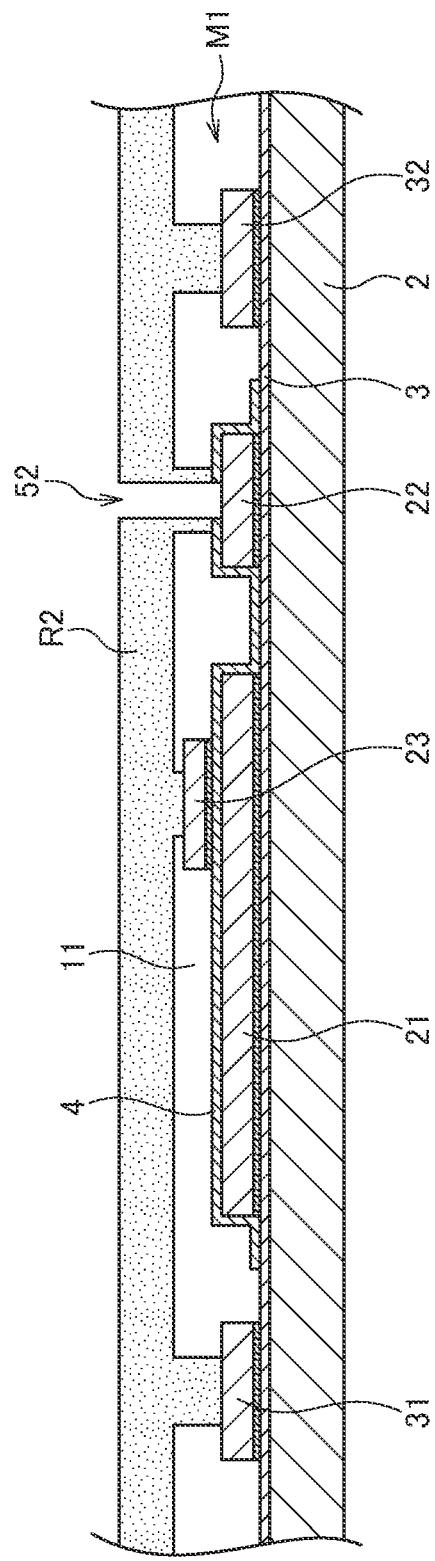

Then, as illustrated in FIG. 12, a resist layer R2 is formed on the insulating layer 11, followed by formation of an opening 52 in the resist layer R2. As a result, the dielectric film 4 that covers the upper surface of the conductive pattern 22 is exposed through the opening 52. In this state, ion milling or other method is applied to remove the dielectric film 4 exposed to the opening 52 to expose the upper surface of the conductive pattern 22.

Figure 13:
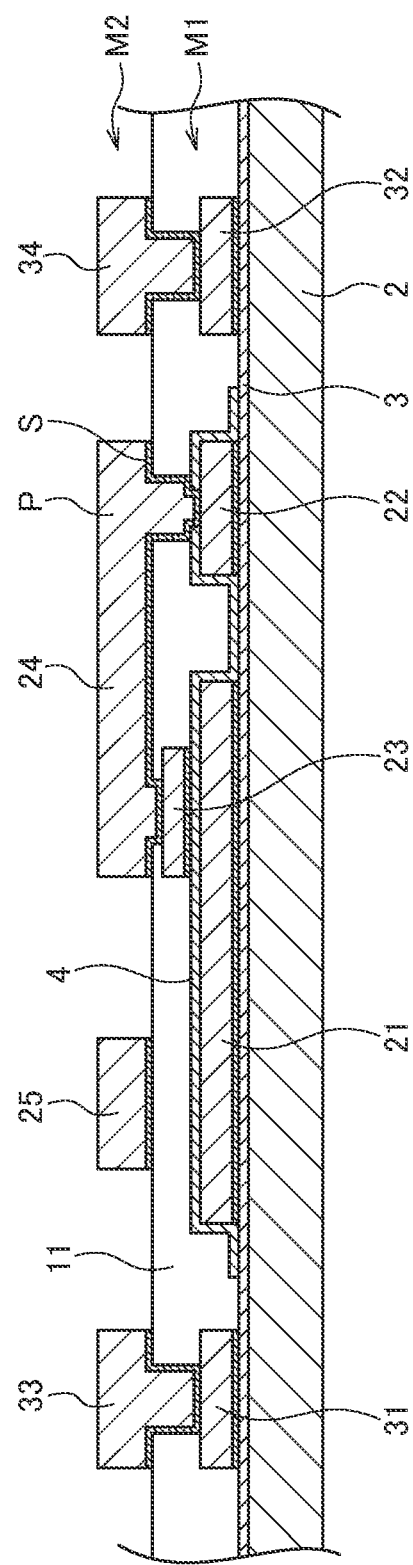
Figure 14:
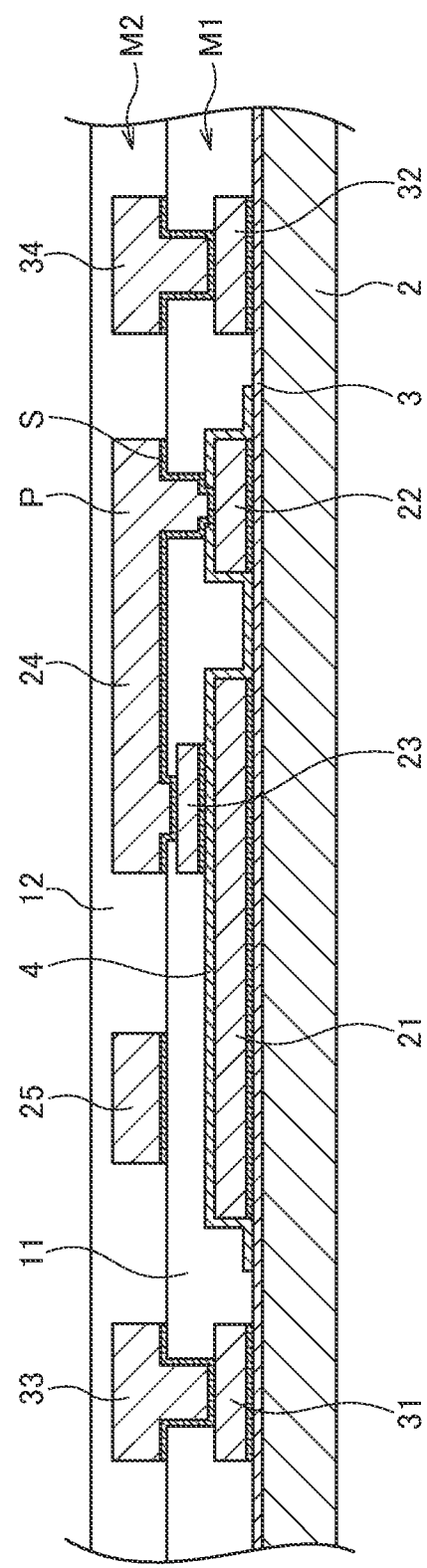

Then, the resist layer R2 is removed, and the conductive layer M2 is formed on the insulating layer 11 using the same method as the formation method for the conductive layer M1 as illustrated in FIG. 13. In the cross section illustrated in FIG. 13, the conductive layer M2 includes the conductive patterns 24, 25 and sacrificial patterns 33, 34. The conductive patterns and sacrificial patterns constituting the conductive layer M2 are each also formed of a laminated body of the seed layer S and plating layer P. The conductive pattern 24 is connected to the conductive patterns 22 and 23 through openings formed in the insulating layer 11, and the sacrificial patterns 33 and 34 are connected respectively to the sacrificial patterns 31 and 32 through opening formed in the insulating layer 11. Subsequently, the insulating layer 12 is formed so as to cover the conductive layer M2 as illustrated in FIG. 14.

Figure 15:
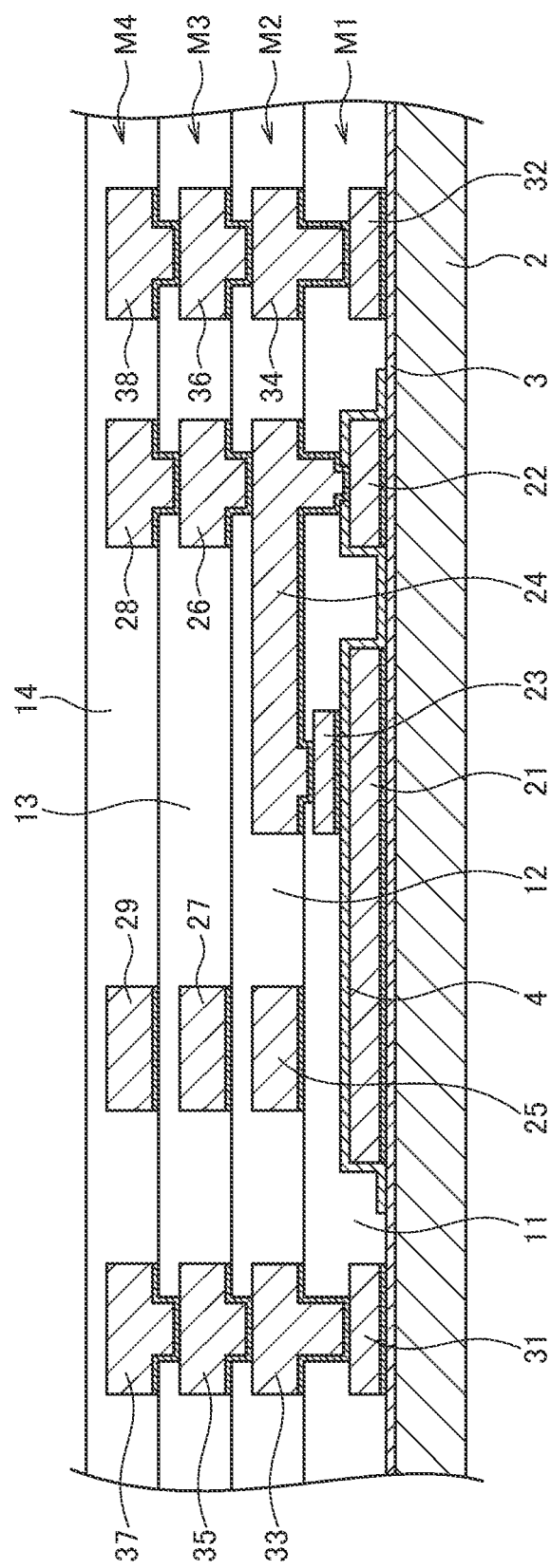

Thereafter, the same processes as above are repeated to form the conductive layer M3, insulating layer 13, conductive layer M4, and insulating layer 14 in this order as illustrated in FIG. 15. In the cross section illustrated in FIG. 15, the conductive layer M3 includes the conductive patterns 26, 27 and sacrificial patterns 35, 36, and the conductive layer M4 includes the conductive patterns 28, 29 and sacrificial patterns 37, 38. The conductive pattern 26 is connected to the conductive pattern 24 through an opening formed in the insulating layer 12, and the sacrificial patterns 35 and 36 are connected respectively to the sacrificial patterns 33 and 34 through openings formed in the insulating layer 12. The conductive pattern 28 is connected to the conductive pattern 26 through an opening formed in the insulating layer 13, and the sacrificial patterns 37 and 38 are connected respectively to the sacrificial patterns 35 and 36 through openings formed in the insulating layer 13.

Figure 16:
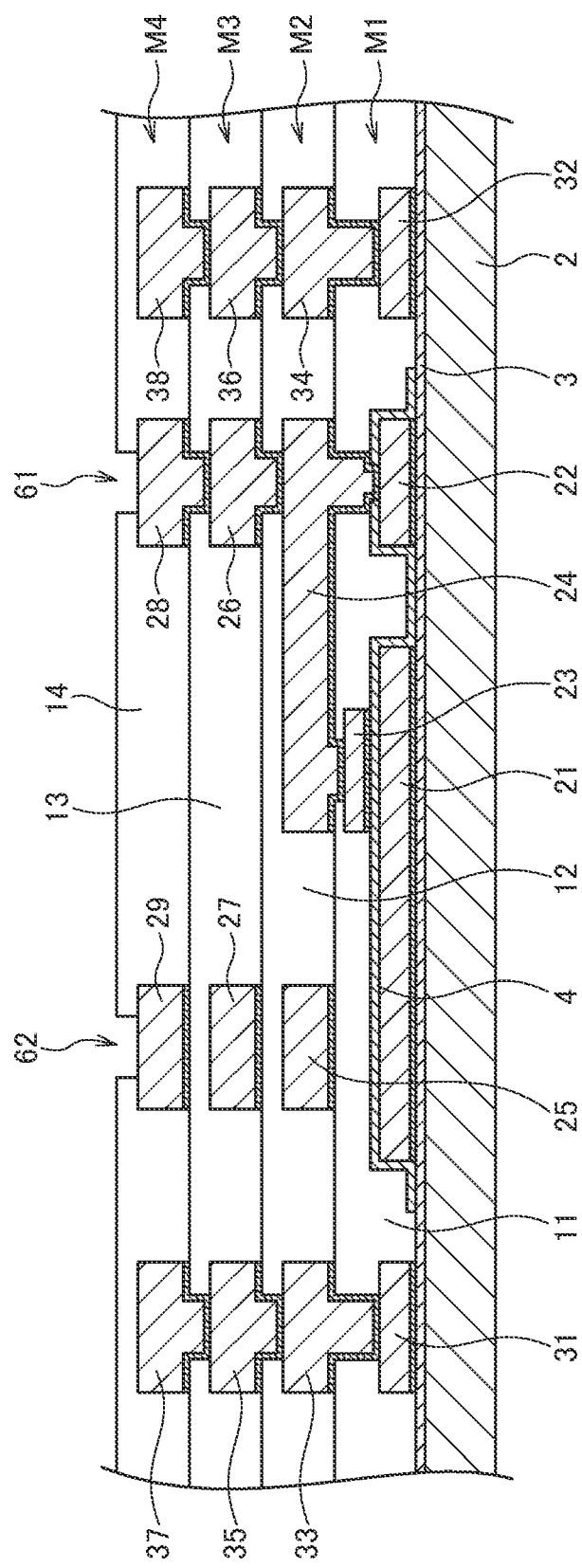
Figure 17:
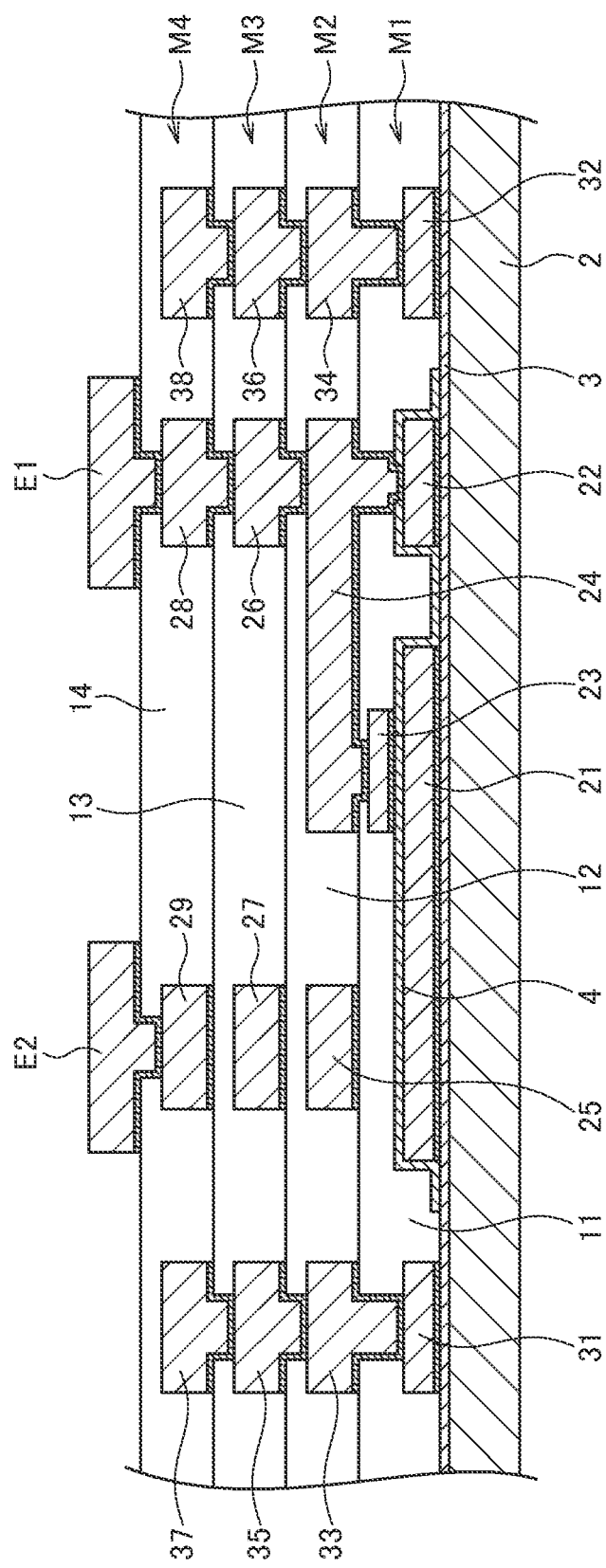

Then, as illustrated in FIG. 16, the insulating layer 14 is patterned to form openings 61 and 62. In this state, the upper surfaces of the conductive patterns 28 and 29 are exposed through the openings 61 and 62, respectively. Then, as illustrated in FIG. 17, the terminal electrodes E1 and E2 are formed on the insulating layer 14. The terminal electrode E1 is connected to the conductive pattern 28 through an opening formed in the insulating layer 14, and the terminal electrode E2 is connected to the conductive pattern 29 through an opening formed in the insulating layer 14.

Figure 18:
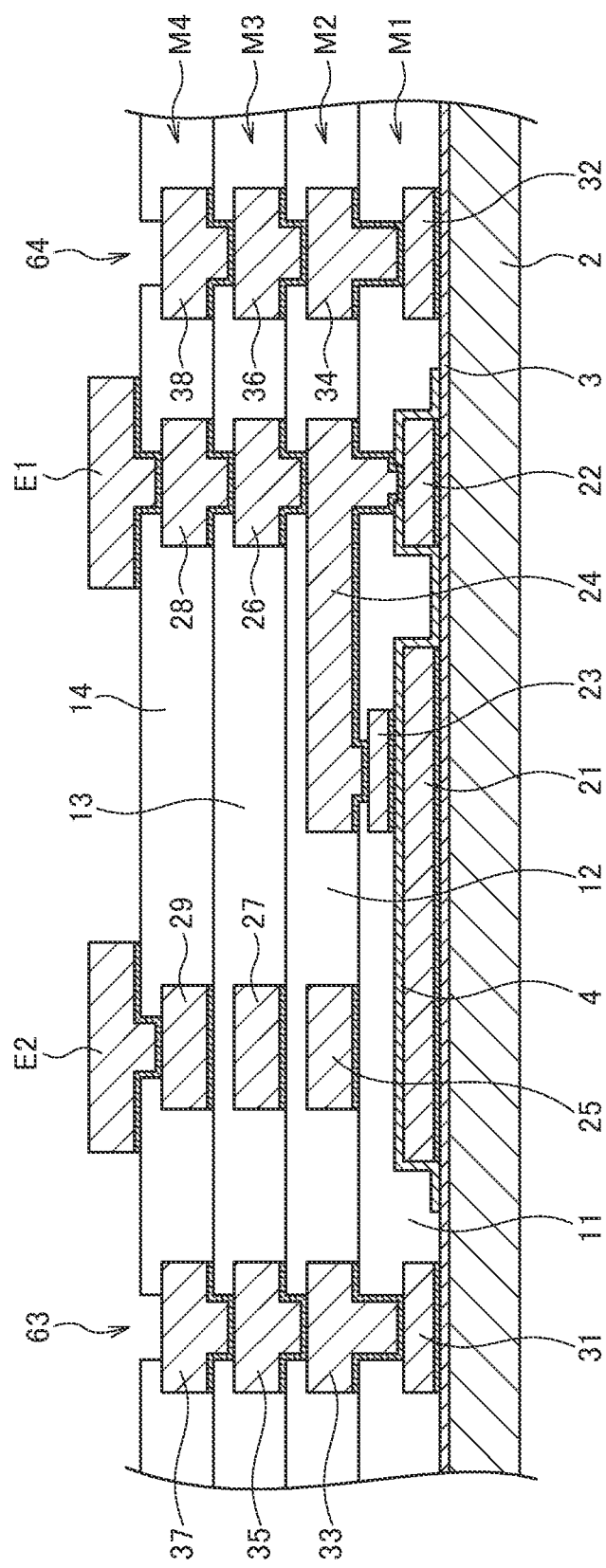
Figure 19:
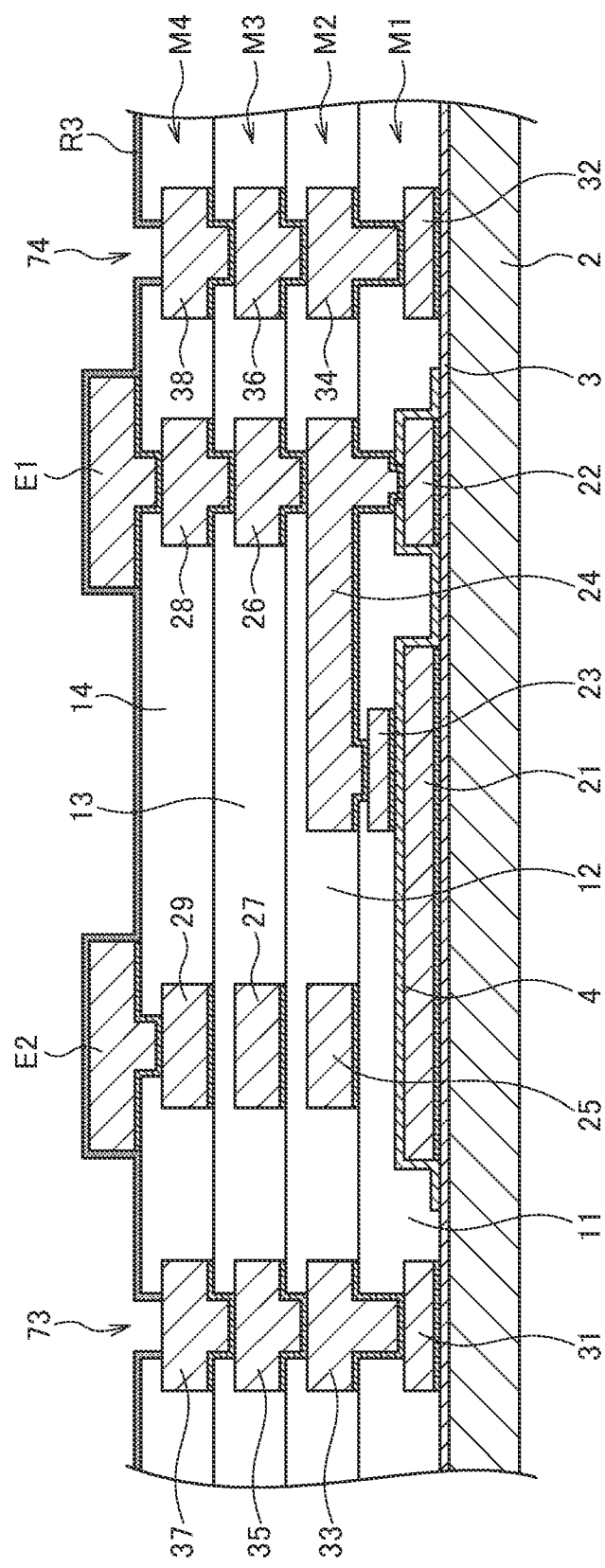
Figure 20:
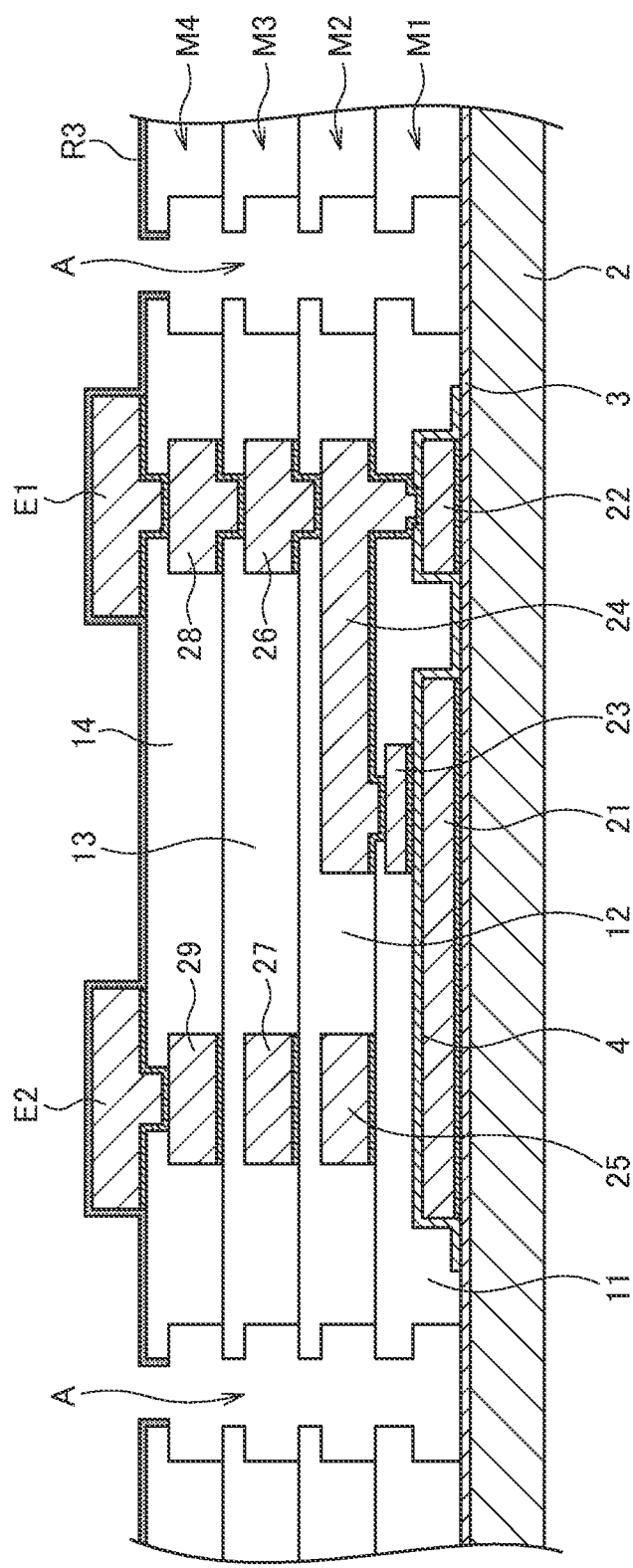

Then, as illustrated in FIG. 18, the insulating layer 14 is patterned to form openings 63 and 64. In this state, the upper surfaces of the sacrificial patterns 37 and 38 are exposed through the openings 63 and 64, respectively. Then, as illustrated in FIG. 19, a resist layer R3 is formed on the entire surface of the insulating layer 14, including the terminal electrodes E1 and E2, and openings 73 and 74 are formed in the resist layer R3 so as to expose therethrough the sacrificial patterns 37 and 38, respectively. Then, etching is performed using, e.g., acid to remove the sacrificial patterns 31 to 38 as illustrated in FIG. 20. As a result, a space A is formed in the area formed by the removal of the sacrificial patterns 31 to 38.

Figure 21:
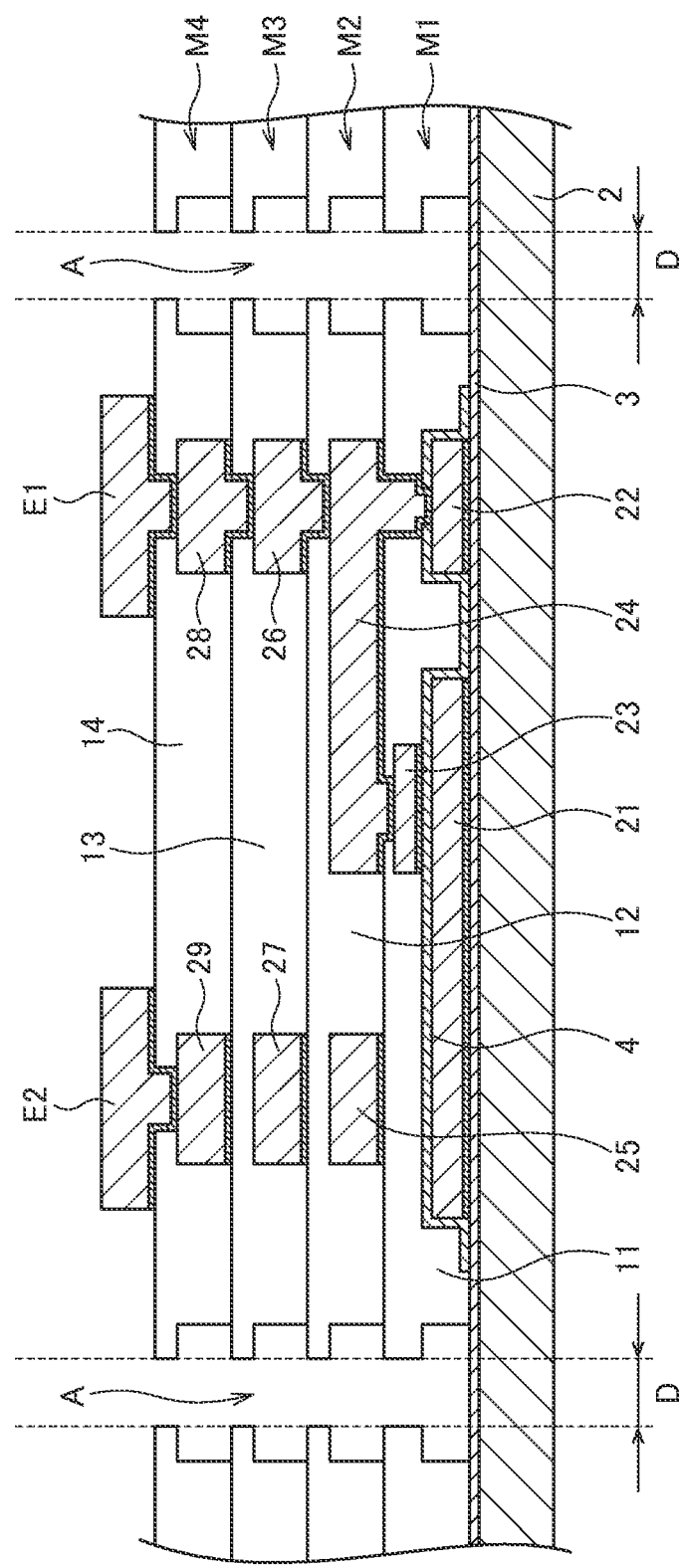

Then, the resist layer R3 is removed, and the substrate 2 is cut along the space A as illustrated in FIG. 21 to individualize the electronic components 1. Thus, the electronic component 1 according to the present embodiment is completed.

Figure 22:
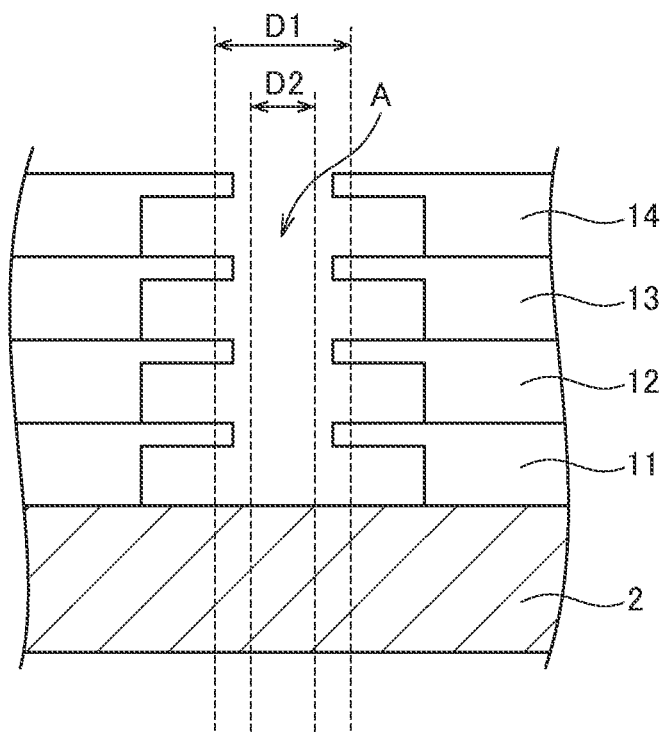
FIG. 22 is a partial cross-sectional view showing the relationship between dicing widths D1, D2 and space A.

The symbol D illustrated in FIG. 21 denotes a dicing width (cutting margin). The dicing width D is smaller than the maximum width of the space A, with the result that the side surfaces of each of the individualized electronic components 1 each have the recess-and-projection shape. The relationship between the dicing width D and the minimum width of the space A is not particularly limited. In this regard, as illustrated in FIG. 22, when the dicing width (D1) is larger than the minimum width of the space A, the distal ends of the projecting parts 11b to 14b of the insulating layers 11 to 14 are removed, so that the side surface 2s of the substrate 2 and the end surfaces of the projecting parts 11b to 14b are flush with each other; on the other hand, when the dicing width (D2) is smaller than the minimum width of the space A, the side surface 2s of the substrate 2 projects from the projecting parts 11b to 14b. Thus, to minimize the outer diameter size of the electronic component 1, the dicing width is preferably set to D1.

Figure 23:
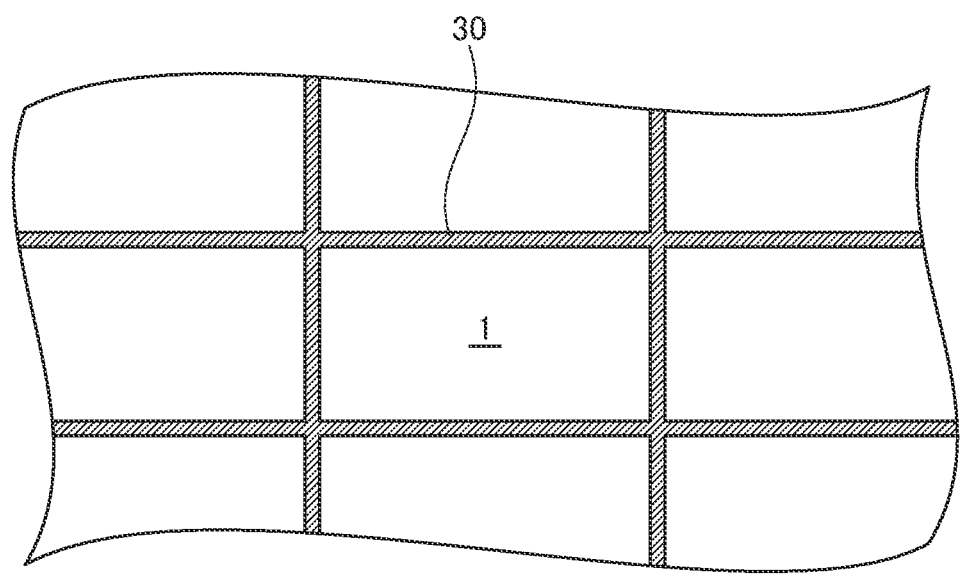
FIG. 23 is a schematic plan view for explaining a method for forming a recess-and-projection shape over the entire side periphery of the electronic component 1.
Figure 24:
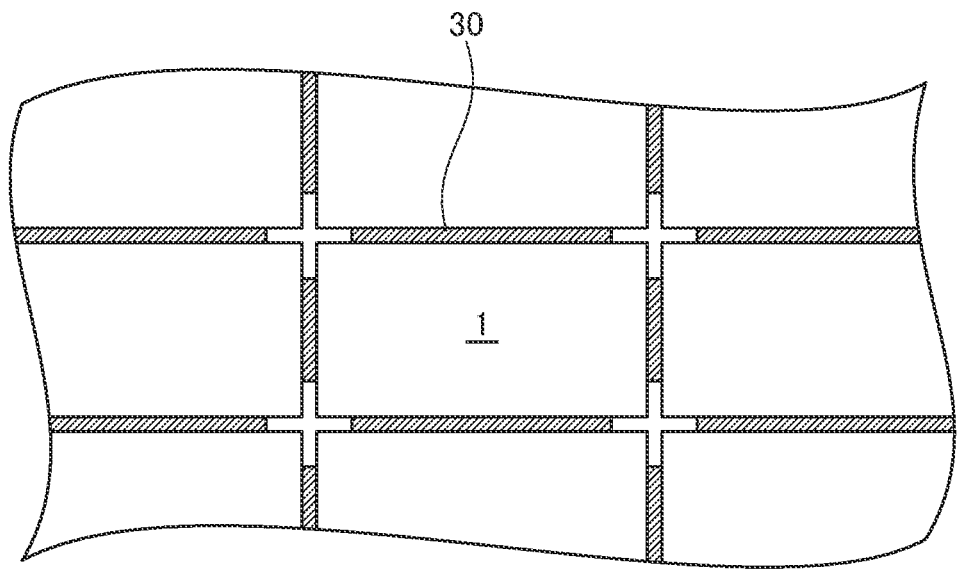
FIG. 24 is a schematic plan view for explaining a method for forming a recess-and-projection shape only on a part of the side periphery of the electronic component 1.
Figure 25:
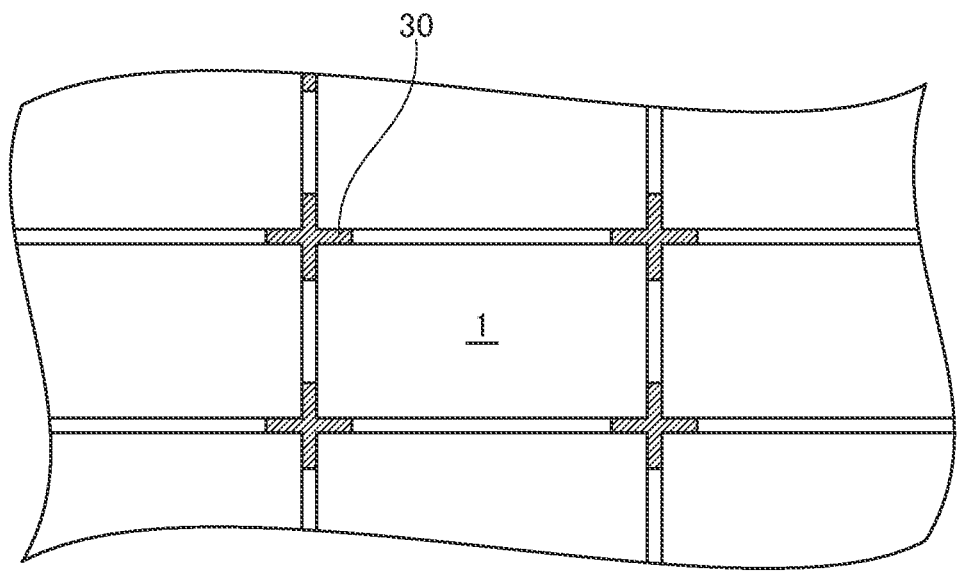
FIG. 25 is a schematic plan view for explaining a method for forming a recess-and-projection shape only on a part of the side periphery of the electronic component 1, the part being different from that shown in FIG. 24.

The recess-and-projection shape may be formed over the entire side periphery of the electronic component 1 or may be formed partially on each of the side surfaces of the electronic component 1. To form the recess-and-projection shape over the entire side periphery, the sacrificial pattern 30 is formed on the entire side periphery of the electronic component 1 as illustrated in FIG. 23, which is a plan view. To form the recess-and-projection shape only partially on each side surface, the sacrificial pattern 30 is formed on a part of the side periphery as illustrated in FIGS. 24 and 25, which are plan views. In the example of FIG. 24, the sacrificial pattern 30 is formed only on the straight portion of the side surface of the electronic component 1 and omitted at the corner portion. In this case, the insulating layers 11 to 14 remain at the corner portion where the sacrificial pattern 30 is absent, so that it is necessary to dice the insulating layers 11 to 14 positioned at the corner portion at the time of individualization. In the example of FIG. 25, the sacrificial pattern 30 is formed only at the corner portion of the side surface of the electronic component 1. In this case, the insulating layers 11 to 14 remain at the straight portion where the sacrificial pattern 30 is absent, so that it is necessary to dice the insulating layers 11 to 14 positioned at the straight portion at the time of individualization.

As described above, in the electronic component 1 according to the present embodiment, the side surfaces 11s to 14s of the insulating layers 11 to 14 each have the recess-and-projection shape, thus improving heat dissipation from the side surfaces 11s to 14s and making it less likely for the solder covering the terminal electrodes E1 and E2 to flow around to the side surfaces 11s to 14s. In addition, in the manufacturing process of the electronic component 1, the substrate 2 is diced along the space A formed by removal of the sacrificial patterns 31 to 38, so that a load applied to a dicing blade is significantly reduced. This facilitates dicing even when the number of insulating layers is large, or when the thickness of the insulating layer is large.

Figure 26:
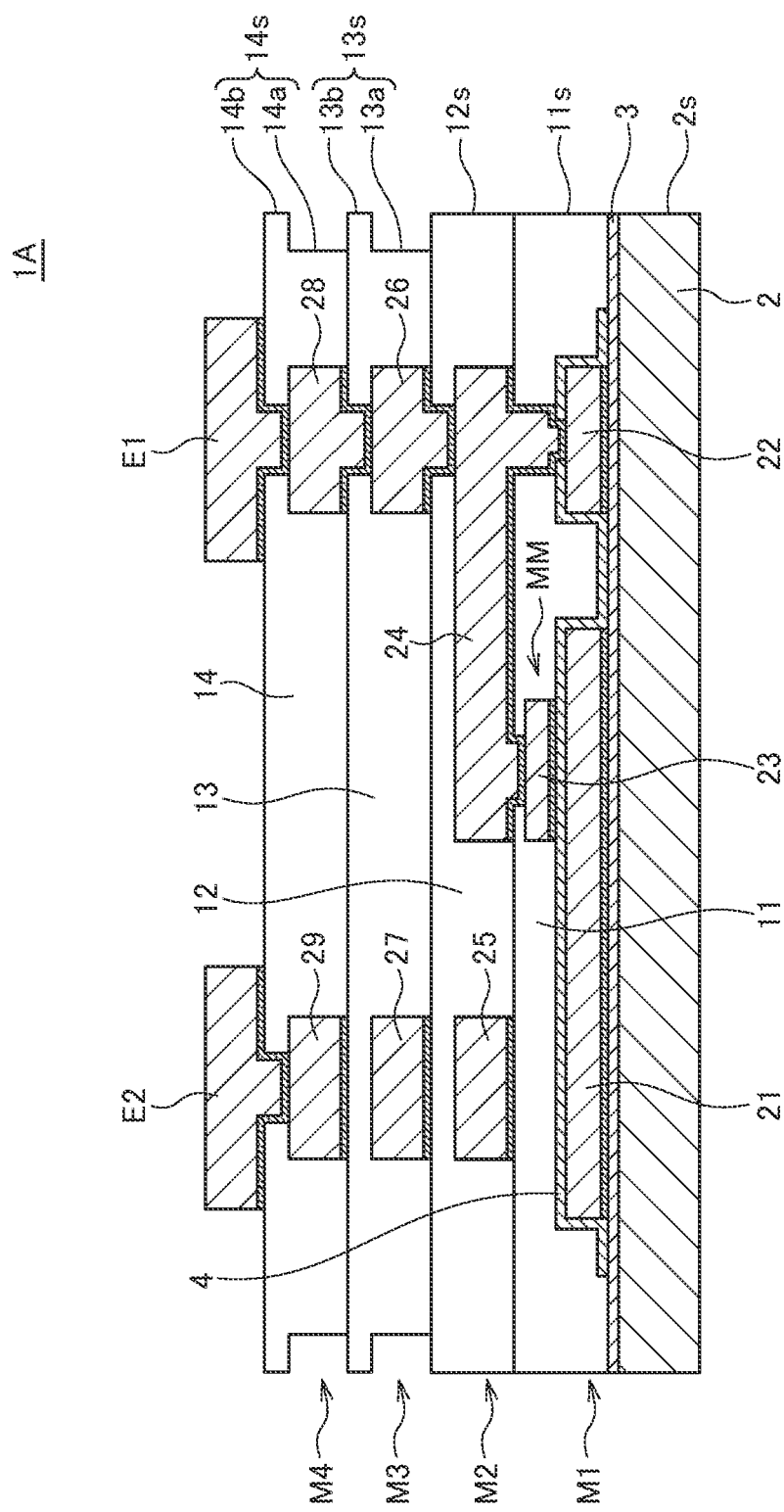
FIG. 26 is a cross-sectional view for explaining the structure of an electronic component 1A according to a first modification.

In the electronic component 1 according to the above embodiment, the side surfaces 11s to 14s of the insulating layers 11 to 14 each have the recess-and-projection shape; however, this is not essential in the present invention, and it suffices that the side surface of at least one insulating layer has the recess-and-projection shape. For example, as in an electronic component 1A according to a first modification illustrated in FIG. 26, a configuration may be adopted, in which the side surfaces 13s and 14s of the insulating layers 13 and 14 each have the recess-and-projection shape, and the side surfaces 11s and 12s of the insulating layers 11 and 12 are each flat. Such a configuration can be obtained by omitting the sacrificial patterns 31 to 34 positioned in the conductive layers M1 and M2.

Figure 27:
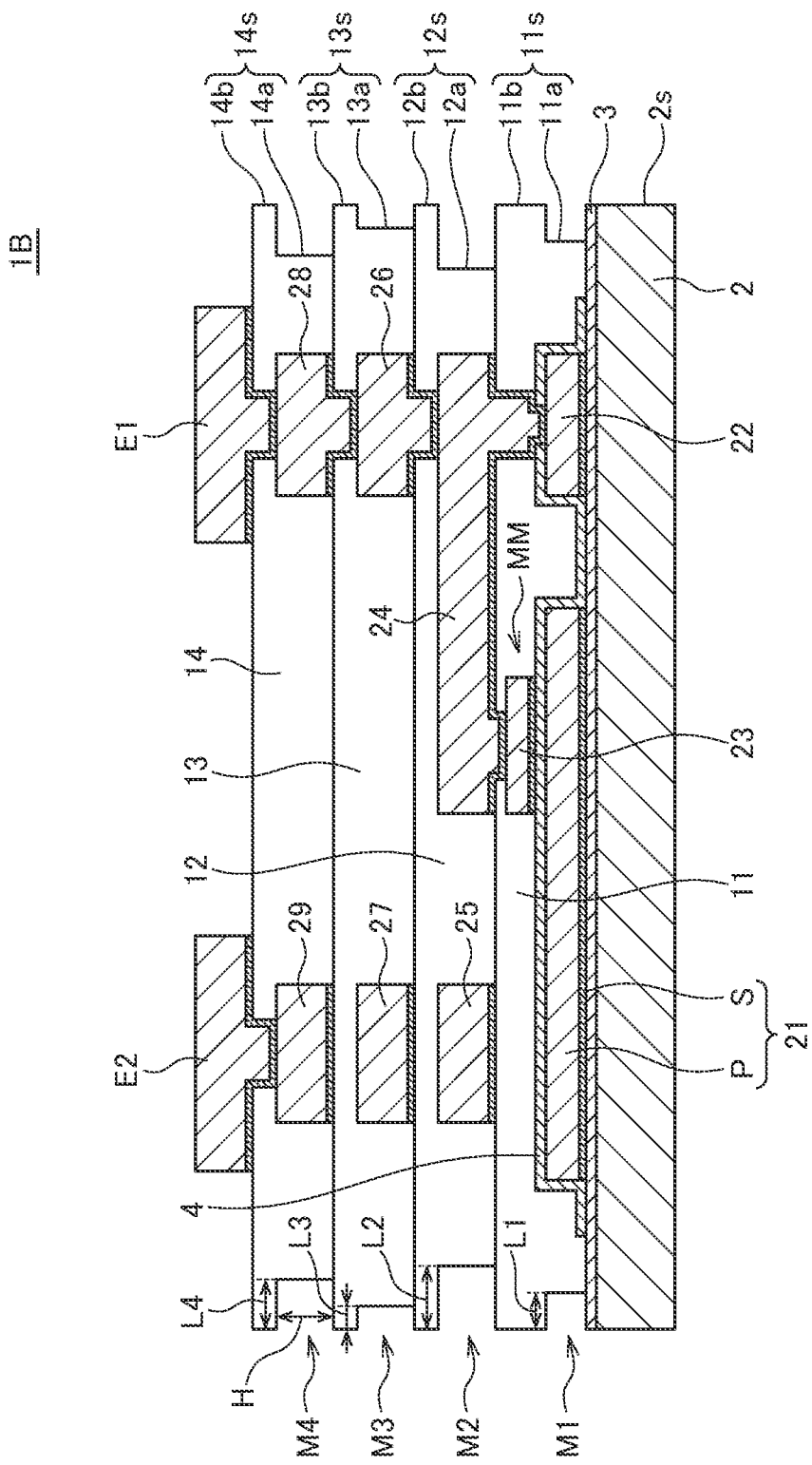
FIG. 27 is a cross-sectional view for explaining the structure of an electronic component 1B according to a second modification.

FIG. 27 is a cross-sectional view for explaining the structure of an electronic component 1B according to a second modification.

The electronic component 1B illustrated in FIG. 27 differs from the electronic component 1 illustrated in FIG. 1 in that the projecting amount of the projecting parts 11b to 14b from the recessed parts 11a to 14a is not constant but differs for respective insulating layers 11 to 14. Other basic configurations are the same as those of the electronic component 1 illustrated in FIG. 1, so the same reference numerals are given to the same elements, and overlapping description will be omitted.

In the electronic component 1B illustrated in FIG. 27, assuming that the projecting amounts of the projecting parts 11b to 14b from the recessed parts 11a to 14a are L1, L2, L3, and L4, respectively, the relationship of L2>L4>L3>L1 is satisfied. As exemplified by the electronic component 1B according to the second modification, the projecting amounts L1 to L4 may not necessarily be the same, and some or all of the projecting amounts may differ. By setting the projecting amounts L1 to L4 to mutually different values, it is possible to obtain a stress dispersion effect.

Figure 28:
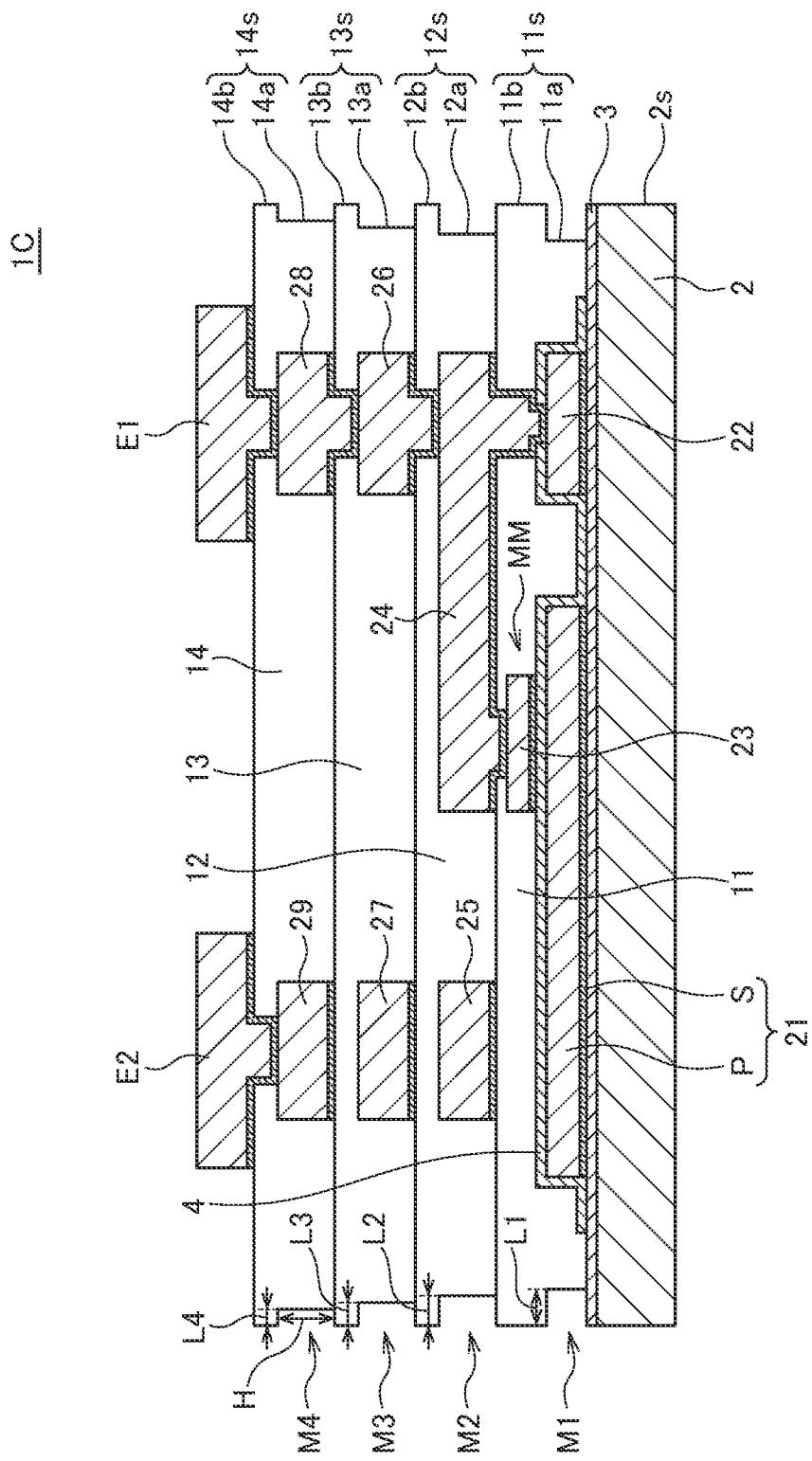
FIG. 28 is a cross-sectional view for explaining the structure of an electronic component 1C according to a third modification.

FIG. 28 is a cross-sectional view for explaining the structure of an electronic component 1C according to a third modification.

The electronic component 1C illustrated in FIG. 28 differs from the electronic component 1B illustrated in FIG. 27 in that the projecting amounts L1 to L4 satisfy the relationship of L1>L2>L3>L4. Other basic configurations are the same as those of the electronic component 1B illustrated in FIG. 27, so the same reference numerals are given to the same elements, and overlapping description will be omitted. According to such a structure, it is possible to further enhance rigidity of upper insulating layers which are likely to have insufficient rigidity.

It is apparent that the present invention is not limited to the above embodiments, but may be modified and changed without departing from the scope and spirit of the invention.

For example, although the present invention is applied to an LC filter in the above embodiment, the target electronic component of the present invention is not limited to the LC filter, but may be electronic components of other types.

What is claimed is:

1. An electronic component comprising:
    a substrate; and
    a plurality of conductive layers and a plurality of insulating layers which are alternately laminated on the substrate,
    wherein each of the plurality of insulating layers has a lower surface, an upper surface, and a side surface,
    wherein the plurality of insulating layers are laminated such that the upper surface of lower ones of the plurality of insulating layers contacts with the lower surface of upper ones of the plurality of insulating layers,
    wherein the side surface of at least one of the plurality of insulating layers has a recessed part set back from a side surface of the substrate and a projecting part projecting from the recessed part, and
    wherein the at least one of the plurality of insulating layers has the recessed part and the projection part over an entire side periphery thereof.

2. The electronic component as claimed in claim 1, wherein side surfaces of all the plurality of insulating layers have the recessed part and the projecting part.

3. The electronic component as claimed in claim 1, wherein the side surface of the substrate and an end surface of the projecting part are flush with each other.

4. The electronic component as claimed in claim 1, wherein a projecting amount of the projecting part from the recessed part is 3 μm or more and 10 μm or less.

5. The electronic component as claimed in claim 1, wherein the electronic component functions as an LC filter.

6. The electronic component as claimed in claim 1, wherein the upper surface of a lower one of the plurality of insulating layers is exposed on the recessed part of an upper one of the plurality of insulating layers.

7. The electronic component as claimed in claim 1, further comprising a planarizing layer located between the substrate and a lowermost one of the plurality of insulating layers.

8. The electronic component as claimed in claim 7, wherein the planarizing layer comprises alumina or silicon oxide.

9. The electronic component as claimed in claim 1,
    wherein the plurality of insulating layers includes first and second insulating layers, and wherein a projecting amount of the projecting part from the recessed part of the first insulating layer is different from a projecting amount of the projecting part from the recessed part of the second insulating layer.

10. The electronic component as claimed in claim 1, wherein the plurality of conductive layers includes a first conductive layer having a first conductive pattern and a second conductive layer having a second conductive pattern,
wherein the plurality of insulating layers includes first and second insulating layers,
wherein the first conductive pattern is embedded in the first insulating layer, and
wherein the second conductive pattern is embedded in the second insulating layer and connected to the first conductive pattern through an opening formed in the first insulating layer.

11. An electronic component comprising:
a substrate;
a planarizing layer formed on the substrate;
a first conductive layer formed on the planarizing layer; and
a first insulating layer formed on the planarizing layer such that the first conductive layer is embedded in the first insulating layer,
wherein a side surface of the first insulating layer has a recessed part set back from a side surface of the substrate and a projecting part projecting from the recessed part, such that a part of the planarizing layer is exposed on the recessed part of the first insulating layer, and
wherein the substrate comprises silicon single crystal, alumina, sapphire, aluminium nitride, MgO single crystal, SrTiO3 single crystal, surface-oxidized silicon, glass, quartz, or ferrite.

12. The electronic component as claimed in claim 11, wherein the planarizing layer comprises alumina or silicon oxide.

13. The electronic component as claimed in claim 11, further comprising:
a second conductive layer formed on the first insulating layer; and
a second insulating layer formed on the first insulating layer such that the second conductive layer is embedded in the second insulating layer,
wherein a side surface of the second insulating layer has a recessed part set back from the side surface of the substrate and a projecting part projecting from the recessed part, such that a part of an upper surface of the first insulating layer is exposed on the recessed part of the second insulating layer.

14. The electronic component as claimed in claim 13, wherein a lower surface of the second insulating layer contacts with the upper surface of the first insulating layer.

15. An electronic component comprising:
a substrate;
a first conductive layer formed over the substrate;
a first insulating layer formed over the substrate such that the first conductive layer is embedded in the first insulating layer;
a second conductive layer formed on the first insulating layer; and
a second insulating layer formed on the first insulating layer such that the second conductive layer is embedded in the second insulating layer,
wherein a side surface of the first insulating layer has a first recessed part set back from a side surface of the substrate and a first projecting part projecting from the first recessed part, and
wherein a side surface of the second insulating layer has a second recessed part set back from the side surface of the substrate and a second projecting part projecting from the second recessed part, and
wherein a projecting amount of the first projecting part from the first recessed part of the first insulating layer is different from a projecting amount of the second projecting part from the second recessed part of the second insulating layer.

16. The electronic component as claimed in claim 15, wherein the first conductive layer has a first conductive pattern,
wherein the second conductive layer has a second conductive pattern, and
wherein the second conductive pattern is connected to the first conductive pattern through an opening formed in the first insulating layer.

* * * * *